United States Patent
Nishi

(10) Patent No.: US 8,625,193 B2
(45) Date of Patent: Jan. 7, 2014

(54) OPTICAL SEMICONDUCTOR DEVICE

(75) Inventor: Kenichi Nishi, Kanagawa (JP)

(73) Assignee: QD Laser, Inc., Kawasaki-shi (JP)

( * ) Notice: Subject to any disclaimer, the term of this patent is extended or adjusted under 35 U.S.C. 154(b) by 339 days.

(21) Appl. No.: 13/121,528

(22) PCT Filed: Jul. 30, 2009

(86) PCT No.: PCT/JP2009/063598
§ 371 (c)(1),
(2), (4) Date: Mar. 29, 2011

(87) PCT Pub. No.: WO2010/038542
PCT Pub. Date: Apr. 8, 2010

(65) Prior Publication Data
US 2011/0181945 A1    Jul. 28, 2011

(30) Foreign Application Priority Data

Oct. 1, 2008 (JP) .................................. 2008-256013

(51) Int. Cl.
*H01S 5/30*        (2006.01)
(52) U.S. Cl.
USPC ........................................................ 359/344
(58) Field of Classification Search
USPC .................................................. 359/344, 337
See application file for complete search history.

(56) References Cited

U.S. PATENT DOCUMENTS

| | | | |
|---|---|---|---|
| 5,608,229 A | 3/1997 | Mukai | |
| 6,606,334 B1 | 8/2003 | Shigihara et al. | |
| 7,706,422 B2 * | 4/2010 | Takagi | ........................ 372/44.01 |
| 2005/0242359 A1 | 11/2005 | Yoshida et al. | |

FOREIGN PATENT DOCUMENTS

| | | |
|---|---|---|
| JP | 5-145183 | 6/1993 |
| JP | 8-88345 | 4/1996 |
| JP | 11-307860 | 11/1999 |
| JP | 2001-210910 | 8/2001 |
| JP | 2003-309322 A1 | 10/2003 |
| JP | 2004-289010 | 10/2004 |
| JP | 2005-039107 | 2/2005 |
| JP | 2005-268573 A1 | 9/2005 |
| WO | WO 2004/055900 A1 | 7/2004 |

OTHER PUBLICATIONS

Notification of Reasons for Refusal received in counterpart application No. 2008-256013 mailed Dec. 11, 2012 with English translation.
International Search Report for International Application No. PCT/JP2009/063598 dated Aug. 12, 2009.

* cited by examiner

*Primary Examiner* — Mark Hellner
(74) *Attorney, Agent, or Firm* — Kratz, Quintos & Hanson, LLP

(57) ABSTRACT

The present invention is an optical semiconductor device including a lower clad layer 12 having a first conduction type, an active layer 14 that is provided on the lower clad layer 12 and has multiple quantum dot layers 51-55 having multiple quantum dots 41, and an upper clad layer 18 that is provided on the active layer 14 and has a second conduction type opposite to the first conduction type, the multiple quantum dot layers 51-55 having different quantum dot densities.

6 Claims, 4 Drawing Sheets

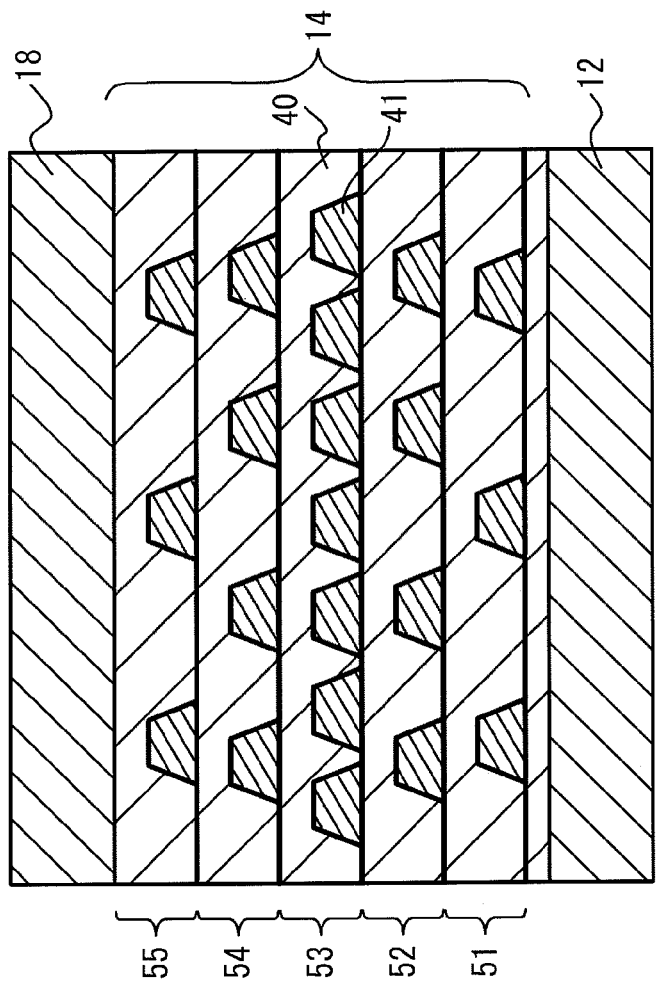

OPTICAL SEMICONDUCTOR DEVICE

TECHNICAL FIELD

The present invention relates to optical semiconductor devices, and more particularly, to an optical semiconductor device in which an active layer has multiple quantum dots.

BACKGROUND ART

Recently, there have been developed optical semiconductor devices such as a semiconductor laser and an optical semiconductor amplifier equipped with an active layer having multiple quantum dots. In Patent Document 1, a quantum dot forming method is disclosed.

FIG. 1(a) is a schematic cross-sectional view of a conventional semiconductor laser, and FIG. 1(b) is a guided wave mode of light in the semiconductor laser. Referring to FIG. 1(a), an active layer 14 is provided on a lower clad layer 12 having a first conduction type. The active layer 14 is formed by stacking multiple quantum dot layers 51-55. Each of the quantum dot layers 51-55 has multiple quantum dots 41 and a base layer 40 that covers the quantum dots 41. The quantum dot densities (surface densities of quantum dots) of the quantum dot layers 51-55 are equal to each other. An upper clad layer 18 having a second conduction type opposite to the first conduction type is formed on the active layer 14.

By applying a current to flow between the lower clad layer 12 and the upper clad layer 18, emission of light takes place at the quantum dots 41 in the active layer 14, and emitted light is propagated through the active layer 14. The refractive indexes of the lower clad layer 12 and the upper clad layer 18 are smaller than the refractive index of the base layers 40 with which the active layer 14 is mainly formed. Thus, the guided wave mode of the light propagated through the active layer 14 is the strongest in the vicinity of the center of the active layer 14.

PRIOR ART DOCUMENT

Patent Document

Patent Document 1: Japanese Laid-Open Patent Application No. 8-088345

SUMMARY OF THE INVENTION

Problems to be Solved by the Invention

In the optical semiconductor laser illustrated in FIG. 1(a), in order to increase the device current to enlarge the optical output intensity, the quantum dot density is preferably increased. In the optical semiconductor amplifier, in order to increase the interaction between light and current to improve the light modulation efficiency, the quantum dot density is preferably increased. However, increasing of the quantum dot density leads to increase in crystal strain and results in increased dislocations that become non-radiative centers. Thus, the emission efficiency and the modulation efficiency are degraded.

The present invention was made in view of the above problems and aims to improve the efficiency of an optical semiconductor device having quantum dots.

Means for Solving the Problems

The present invention is an optical semiconductor device characterized by comprising: a lower clad layer having a first conduction type; an active layer that is provided on the lower clad layer and has multiple quantum dot layers having multiple quantum dots; and an upper clad layer that is provided on the active layer and has a second conduction type opposite to the first conduction type, the multiple quantum dot layers having different quantum dot densities.

The above structure may be configured so that the multiple quantum dot layers have different quantum dot densities so that a quantum dot layer that is included in the multiple quantum dot layers and has a strong guided wave mode of light propagated through the active layer has a high quantum dot density and another quantum dot layer that is included in the multiple quantum dot layers and has a weak guided wave mode of light has a low quantum dot density.

The above structure may be configured so that the multiple quantum dot layers are configured to have the quantum dot density that monotonically decreases from a quantum dot layer among the multiple quantum dot layers having a highest quantum dot density towards another quantum dot layer located at an end of the active layer.

The above structure may be configured so that the quantum dot density of a quantum dot layer among the multiple quantum dot layers located in a center of the active layer is higher than the quantum dot densities of quantum dot layers located on upper and lowers portions of the active layer.

The above structure may be configured so that an uppermost quantum dot layer out of the multiple quantum dot layers has a highest quantum dot density.

The above structure may be configured to comprise a light guide layer having a refractive index larger than refractive indexes of the lower and upper clad layers.

Effects of the Invention

According to the present invention, it is possible to improve the efficiency of the optical semiconductor device.

BRIEF DESCRIPTION OF THE DRAWINGS

FIG. 2(a) is a schematic cross-sectional view of a semiconductor laser in accordance with an embodiment 1, and FIG. 2(b) is a diagram that illustrates a guided wave mode of light in the semiconductor laser;

MODES FOR CARRYING OUT THE INVENTION

A description will now be given of embodiments of the present invention with reference to the drawings.

[Embodiment 1]

FIG. 2(a) is a schematic cross-sectional view of a semiconductor laser in accordance with an embodiment 1, and FIG. 2(b) illustrates a guided wave mode of light in the semiconductor laser. Referring to FIG. 2(a), the quantum dot density (the surface density of quantum dots) is the highest in the center in which the guided wave mode of light is the largest.

In contrast, the quantum dot density is the lowest in the uppermost and the lowermost quantum dot layers 51 and 55 in which the guided wave mode is the weakest. The quantum dot density monotonically decreases from the quantum dot layer 53 to the quantum dot layers 51 and 55.

Figure 1A:
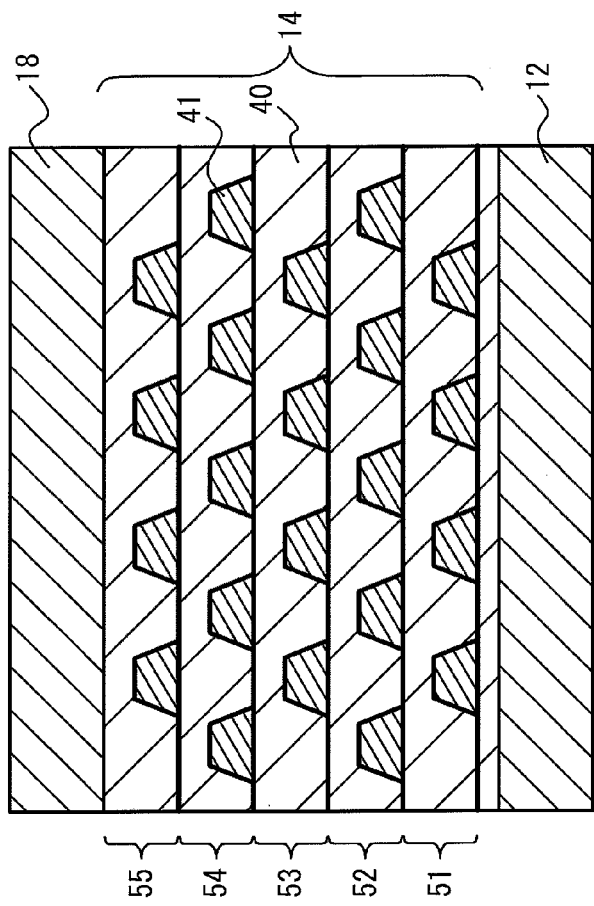
FIG. 1(a) is a schematic cross-sectional view of a conventional semiconductor laser.
Figure 1B:
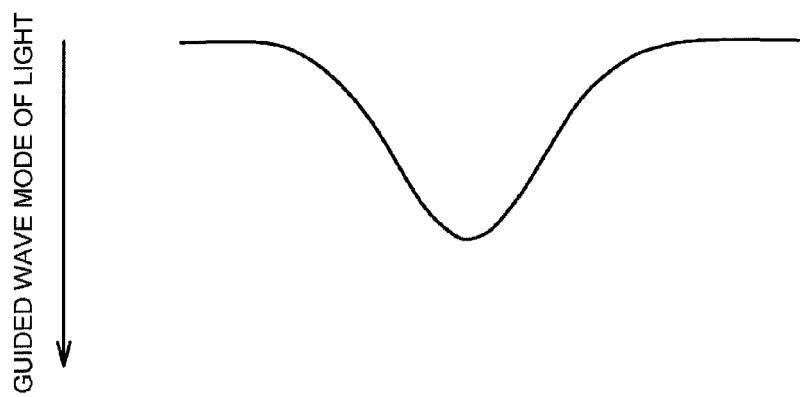
FIG. 1(b) is a diagram that illustrates a guided wave mode of light in the semiconductor laser.

As described above, the quantum dot density of the quantum dot layer 53 located in the center of the active layer 14 composed of the multiple quantum dot layers 51-55 is set higher than the uppermost and lowermost quantum dot layers 51 and 55 of the active layer 14. Thus, the active layer 14 efficiently emits light in the central portion of the active layer 14 having the strong guided wave mode of light. It is thus possible to improve the emission efficiency of the semiconductor laser. Further, in comparison with the conventional semiconductor laser illustrated in FIG. 1(a), the total number of quantum dots in the active layer 14 in the embodiment 1 is made approximately equal to that of the conventional semiconductor laser, so that the crystal strain of the whole active layer 14 is similar to that of the conventional semiconductor laser. Thus, the density of dislocations that cause non-radiative centers in the embodiment 1 is approximately equal to that of the conventional semiconductor laser.

When the lower clad layer 12 and the upper clad layer 18 have almost the same composition, the guided wave mode of light are substantially symmetrical in the vertical directions. It is thus preferable that the quantum dot density is substantially symmetrical in the vertical directions.

[Embodiment 2]

Figure 3A:
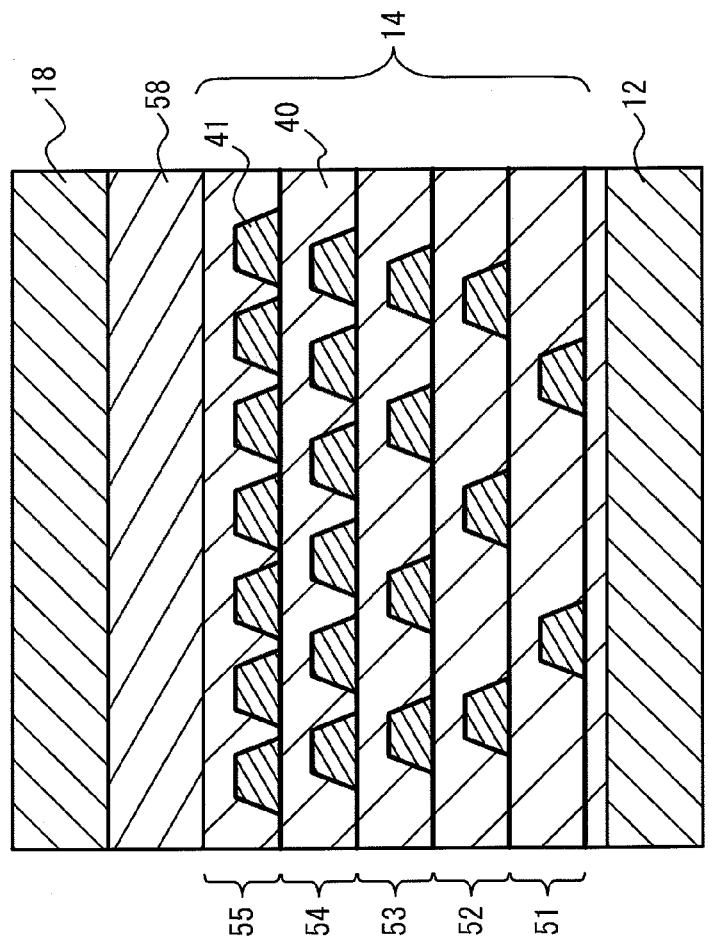
FIG. 3(a) is a schematic cross-sectional view of a semiconductor laser in accordance with the embodiment 1.
Figure 3B:
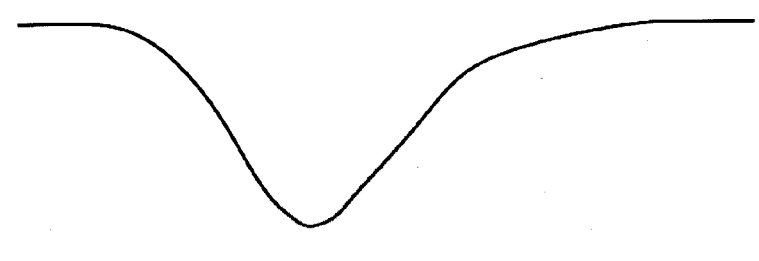
FIG. 3(b) is a diagram that illustrates a guided wave mode of light in the semiconductor laser.

An embodiment 2 is an example in which the quantum dot density of the uppermost quantum dot layer is the highest. FIG. 3(a) is a schematic cross-sectional view of a semiconductor laser in accordance with the embodiment 2, and FIG. 3(b) illustrates a guided wave mode of light in the semiconductor laser. Referring to FIG. 3(a), in the embodiment 2, a light guide layer 58 is provided on the active layer 14, as compared to the embodiment 1 in FIG. 2(a). The light guide layer 58 is a layer having a larger refractive index than those of the upper clad layer 18 and the lower clad layer 12.

The light guide layer 58 has a function of propagating light. Thus, as illustrated in FIG. 3(b), the guided wave mode of light is relatively strong in the vicinity of the center of the active layer 14 and the light guide layer 58. When attention is paid to the active layer 14, the guided wave mode of light is relatively strong in an upper portion of the active layer 14. Therefore, the quantum dot density of the quantum dot layer 55 that is the uppermost of the multiple quantum dot layers is set to the highest. The quantum dot density of the lowermost quantum dot layer 51 is set to the lowest. The quantum dot density is monotonically decreased from the quantum dot layer 55 to the quantum dot layer 51. Thus, the active layer 14 emits light efficiently in the upper area of the active layer 14 having the strong guided wave mode of light. It is thus possible to improve the light emission efficiency of the semiconductor laser.

As in the case of the embodiments 1 and 2, the quantum dot densities of the quantum dot layers 51-55 are varied so that the quantum dot density of the quantum dot layer having the strong guided wave mode of light propagated through the active layer is high and the quantum dot density of the quantum dot layer having the weak guided wave mode of light is low. It is thus possible to improve the light emission efficiency of the semiconductor laser.

For example, in a case where a light guide layer is provided between the active layer 14 and the lower clad layer 12 and the guided wave mode of light in the vicinity of the lower portion of the active layer 14 is thus strengthened, it is possible to set the quantum dot density of the lowermost quantum dot layer 51 to the highest and to set the quantum dot density of the highest quantum dot layer 55 to the weakest.

Generally, the guided wave mode of light has one peak, and monotonically decreases in the vertical directions. Thus, the multiple quantum dot layers 51-55 are preferably configured so that the quantum dot density monotonically decreases from the quantum dot layer having the highest quantum dot density towards the quantum dot layer 51 or 55 located at the end of the active layer 14.

Although the five layers consisting of the quantum dot layers 51-55 are exemplarily described in the embodiments 1 and 2, six quantum dot layers or more may be used. For example, not less than ten quantum dot layers may be used. The size of the quantum dots may be 20 nm in diameter, for example. For example, the quantum dot density of the quantum dot layer having a high quantum dot density may be $6 \times 10^{10}/cm^2$, and the quantum dot density of the quantum dot layer having a low quantum dot density may be $1 \times 10^{10}/cm^2$. In order to obtain the effects of the embodiments 1 and 2, the highest quantum dot density is preferably 1.2 times the lowest quantum dot density in the quantum dot layers 51-55 or more, and is more preferably 1.5 times or more. Much more preferably, the highest quantum dot density is preferably not less than 3.0 times.

Although the embodiments 1 and 2 are exemplary semiconductor lasers, the embodiments 1 and 2 may be applied to the optical semiconductor amplifiers. It is thus possible to increase the interaction between the light and current in the optical semiconductor amplifier and improve the light emission efficiency.

Embodiment 3

Figure 4:
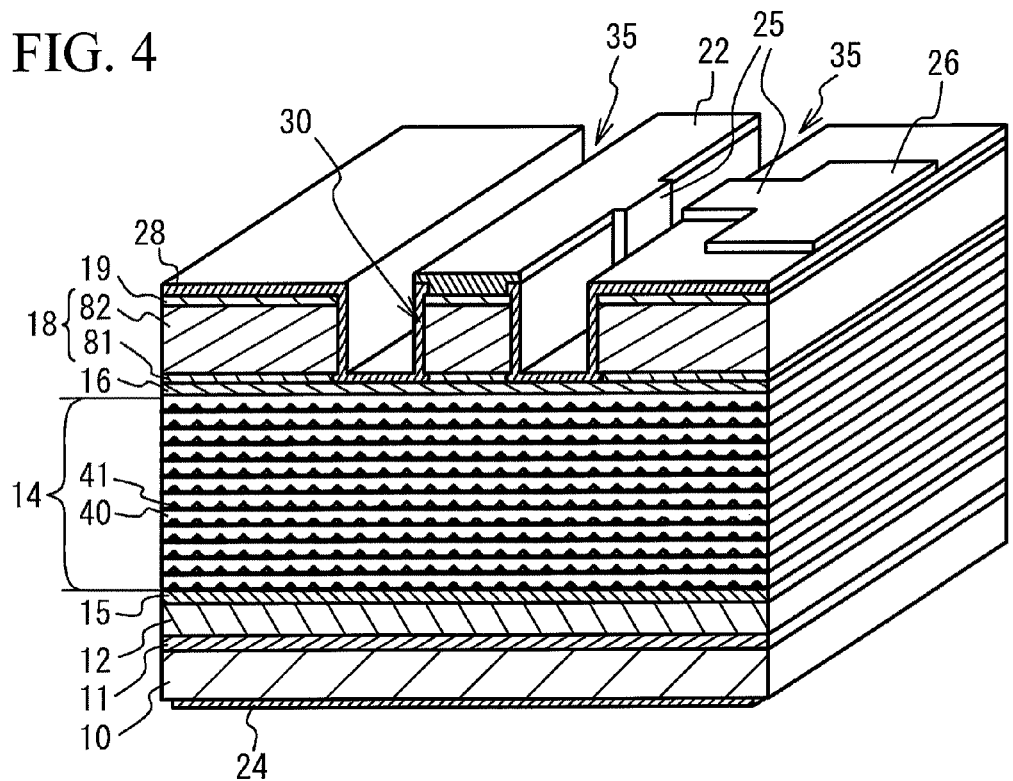
FIG. 4 is a cross-sectional view of a semiconductor laser in accordance with an embodiment 3.

An embodiment 3 is an exemplary semiconductor laser that uses the embodiments 1 and 2. FIG. 4 is a perspective cross-sectional view of the embodiment 3. On a p-type GaAs substrate 10, there are stacked a buffer layer 11 made of p-type GaAs, a lower clad layer 12 made of p-type AlGaAs, a spacer layer 15 made of undoped GaAs, a quantum dot active layer 14 made of multiple quantum dot layers stacked, an upper clad layer 18 made of n-type AlGaAs, and a contact layer 19 made of n-type GaAs, which layers are stacked in series. The active layer 14 is composed of quantum dots 41 and the base layer 40. The upper clad layer 18 is composed of a first layer 81 and a second layer 82. Although the density of the quantum dots 41 is illustrated so as to be uniform in each of boundaries between adjacent quantum dot layers, the quantum dot density is varied in each of the boundaries as in the case of the embodiments 1 and 2. The material, film thickness and the doping density of each layer is described in Table 1.

TABLE 1

| Layer | Material | Film thickness (nm) | Doping density (/cm³) |
|---|---|---|---|
| contact layer | n-GaAs | 600 | $5 \times 10^{18}$ |
| upper clad layer | n-Al$_{0.35}$Ga$_{0.65}$As | 860 | $1 \times 10^{18}$ |
|  | n-Al$_{0.45}$Ga$_{0.55}$As | 200 | $5 \times 10^{17}$ |
| spacer layer | GaAs | 50 | undoped |
| active layer | — | — | — |
| spacer layer | GaAs | 33 | undoped |
| lower clad layer | p-Al$_{0.35}$Ga$_{0.65}$As | 500 | $5 \times 10^{17}$ |
|  | p-Al$_{0.35}$Ga$_{0.65}$As | 900 | $2 \times 10^{18}$ |
| buffer layer | p-GaAs | 500 | $7 \times 10^{18}$ |
| substrate | p-GaAs | — | — |

The upper clad layer 18 and the contact layer 19 form a ridge portion 30. On both sides of the ridge portion 30, recess portions 35 that reach the spacer layer 16 are formed. A silicon oxide film is formed, as a protection film 28, on the contact layer 19 and the surfaces of the recess portions 35. An n-type electrode 22 is formed on the contact layer 19 of the ridge portion 30. A pad 26 that is connected to the n-type electrode 22 via an interconnection 25. A p-type electrode 24 is formed on the lower surface of the substrate 10.

Figure 5:
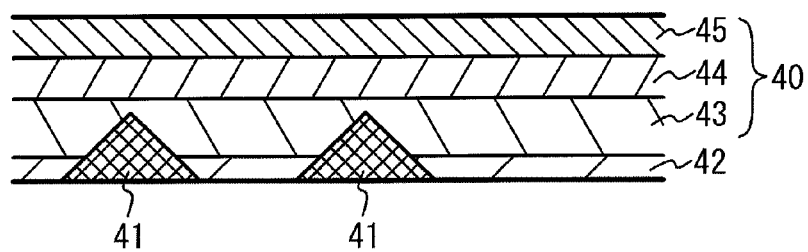
FIG. 5 is a diagram that illustrates a dot layer corresponding to one of layers of a quantum dot active layer.

FIG. 5 is a diagram that illustrates a quantum dot layer that corresponds to one layer in the quantum dot active layer.

TABLE 2

| Layer | Material | Film thickness (nm) | Doping density (/cm$^3$) |
|---|---|---|---|
| undoped GaAs layer | GaAs | 9 | undoped |
| p-type GaAs layer | p-GaAs | 10 | $5 \times 10^{17}$ |
| undoped GaAs layer | GaAs | 14 | undoped |
| InGaAs layer | In$_{0.15}$Ga$_{0.85}$As | 5 | undoped |

Like the embodiment 3, it is possible to use InAs as the quantum dots 41, GaAs as the base layer 40, and AlGaAs as the lower clad layer 12 and the upper clad layer 18. In a case where a light guide layer is employed like the embodiment 2, GaAs may be used as the light guide layer.

Although the preferable embodiments of the invention have been described, the present invention is not limited to the specific embodiments of the present invention but may be varied and changed within the scope of the present invention defined in the claims.

The invention claimed is:

1. An optical semiconductor device comprising:
a lower clad layer having a first conduction type;
an active layer that is provided on the lower clad layer and has multiple quantum dot layers, each quantum dot layer having multiple quantum dots of a substantially uniform density; and
an upper clad layer that is provided on the active layer and has a second conduction type opposite to the first conduction type,
the multiple quantum dot layers being configured so that a quantum dot layer, among the multiple quantum dot layers, that has a strongest guided wave mode of light propagated through the active layer has a highest quantum dot density.

2. The optical semiconductor device according to claim 1, wherein the multiple quantum dot layers are configured so that a quantum dot layer, among the multiple quantum dot layers, that has a weakest guided wave mode of light propagated through the active layer has a lowest quantum dot density.

3. The optical semiconductor device according to claim 1, wherein the multiple quantum dot layers are configured to have the quantum dot density that monotonically decreases from a quantum dot layer, among the multiple quantum dot layers, having a highest quantum dot density towards another quantum dot layer being the uppermost or lowermost quantum dot layer of the active layer.

4. The optical semiconductor device according to claim 1, wherein the quantum dot density of a quantum dot layer, among the multiple quantum dot layers, being the center quantum dot layer of the active layer is higher than the quantum dot densities of quantum dot layers of the active layer on a lower-clad-layer side and an upper-clad-layer side.

5. The optical semiconductor device according to claim 1, wherein an uppermost quantum dot layer, out of the multiple quantum dot layers, has a highest quantum dot density, and a lowermost quantum dot layer has a lowest quantum dot density.

6. The optical semiconductor device according to claim 5, comprising a light guide layer having a refractive index larger than refractive indexes of the lower and upper clad layers, the light being propagated through the light guide layer.

* * * * *